(12) United States Patent
Lachapelle

(10) Patent No.: US 11,781,780 B1
(45) Date of Patent: Oct. 10, 2023

(54) MOVEABLE AIRFLOW BARRIER FOR THROUGHPUT CONTROL IN COOLING UNIT

(71) Applicant: Amazon Technologies, Inc., Seattle, WA (US)

(72) Inventor: Alan Joseph Lachapelle, Reston, VA (US)

(73) Assignee: Amazon Technologies, Inc., Seattle, WA (US)

( * ) Notice: Subject to any disclaimer, the term of this patent is extended or adjusted under 35 U.S.C. 154(b) by 241 days.

(21) Appl. No.: 17/111,349

(22) Filed: Dec. 3, 2020

Related U.S. Application Data

(62) Division of application No. 16/015,007, filed on Jun. 21, 2018, now abandoned.

(51) Int. Cl.
| | | |
|---|---|---|
| *F24F 13/10* | (2006.01) | |
| *F24F 7/10* | (2006.01) | |
| *H05K 7/20* | (2006.01) | |

(52) U.S. Cl.
CPC .............. *F24F 13/10* (2013.01); *F24F 7/10* (2013.01); *H05K 7/20718* (2013.01); *H05K 7/20836* (2013.01)

(58) Field of Classification Search
CPC .......... F24F 7/10; F24F 3/10; H05K 7/20836
USPC ...................................................... 454/358
See application file for complete search history.

(56) References Cited

U.S. PATENT DOCUMENTS

| 2,144,693 A * | 1/1939 | Seid ......................... F24F 3/14 |
| | | 236/44 C |
| 2,884,228 A | 4/1959 | Jorgensen |
| 5,749,415 A | 5/1998 | Dinh |
| 2016/0106008 A1 * | 4/2016 | Cotton ............... H05K 7/20836 |
| | | 62/304 |

FOREIGN PATENT DOCUMENTS

| JP | 2007055382 A | * | 3/2007 | ........... B60H 1/0005 |
| KR | 2016104763 A | * | 9/2016 | ......... B60H 1/00021 |

OTHER PUBLICATIONS

U.S. Appl. No. 16/015,007, Final Office Action, dated Oct. 2, 2020, 10 pages.
U.S. Appl. No. 16/015,007, Non-Final Office Action, dated Apr. 30, 2020, 10 pages.

* cited by examiner

*Primary Examiner* — Allen R. B. Schult
(74) *Attorney, Agent, or Firm* — Kilpatrick Townsend & Stockton LLP

(57) ABSTRACT

An air handling unit can include a first airflow passage and a second airflow passage having separate entrances. A cooling module can be arranged in the second airflow passage for cooling air passing there through. A cover, blocker, or other barrier can move between a position at least partially blocking the first entrance to the first airflow passage and at least partially blocking the second entrance to the second airflow passage. In various aspects, the barrier can be moved to intermediate positions to affect a ratio of air flowing through each of the passages and to thus control an overall amount of cooling provided to discharged air that corresponds to a mixture of the air directed through the cooling module and the air directed around the cooling module, which may be mixed together upon exiting the separate passages.

19 Claims, 10 Drawing Sheets

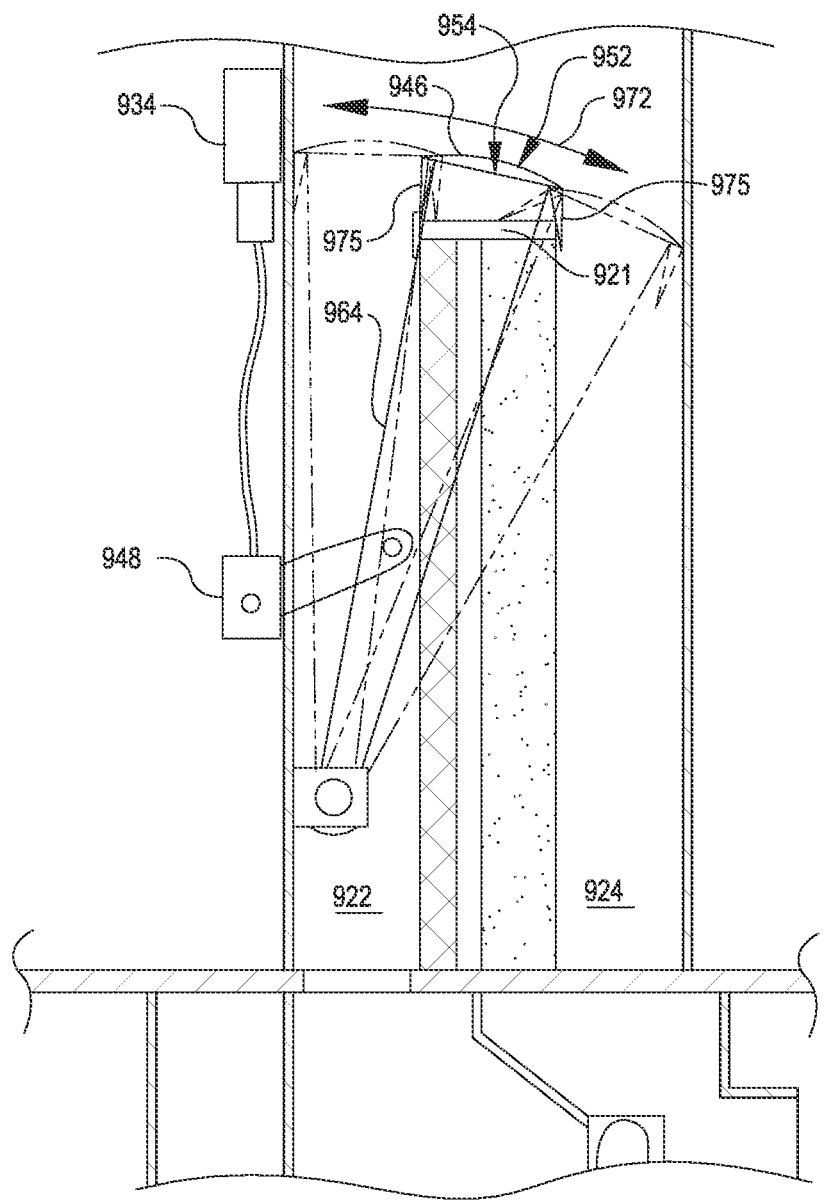

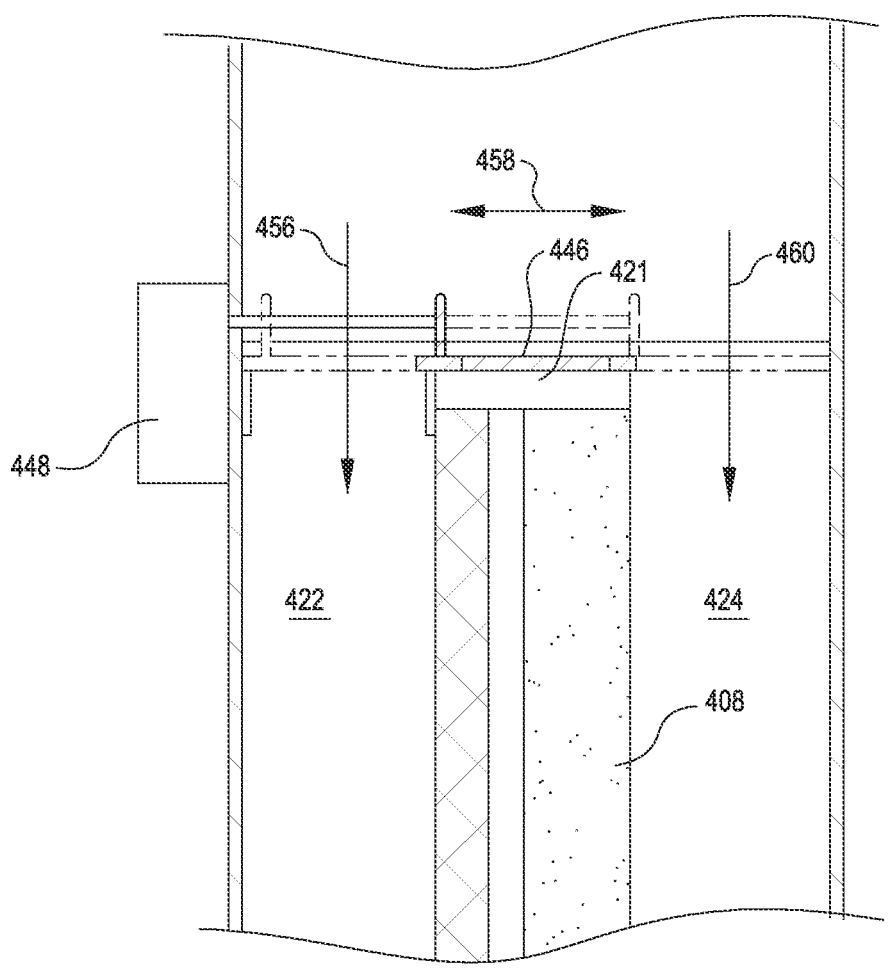

MOVEABLE AIRFLOW BARRIER FOR THROUGHPUT CONTROL IN COOLING UNIT

CROSS REFERENCE TO RELATED APPLICATIONS

This application claims priority to and is a Divisional of U.S. application Ser. No. 16/015,007, filed Jun. 21, 2018, and titled "MOVEABLE AIRFLOW BARRIER FOR THROUGHPUT CONTROL IN COOLING UNIT," the contents of which are herein incorporated in its entirety.

BACKGROUND

Datacenters contain large amounts of computing equipment, which generates large amounts of heat. There is a need to maintain suitable environmental conditions in the datacenter to reduce risks of equipment failure that may make computing resources unavailable. At the same time, a need exists to limit the cost of operating a datacenter. Often, a large part of the cost of operating a datacenter is related to the datacenter's cooling systems and the total electricity cost. Overall, efficiency and operational capacity of cooling systems are often important factors in datacenter design and operations, especially as relatively small gains from changes to individual components can result in non-trivial and appreciable savings when implemented at a large scale across many similar instances.

BRIEF DESCRIPTION OF THE DRAWINGS

Various embodiments in accordance with the present disclosure will be described with reference to the drawings, in which:

FIG. 11 illustrates a side view of the air handling unit of FIG. 9 with a barrier sized for alternatively blocking either or neither of a first airflow passage and the second airflow passage according to various embodiments; and FIG. 12 illustrates a side view of the air handling unit of FIG. 4 with a barrier sized for alternatively blocking either or neither of a first airflow passage and the second airflow passage according to various embodiments.

DETAILED DESCRIPTION

Figure 1:
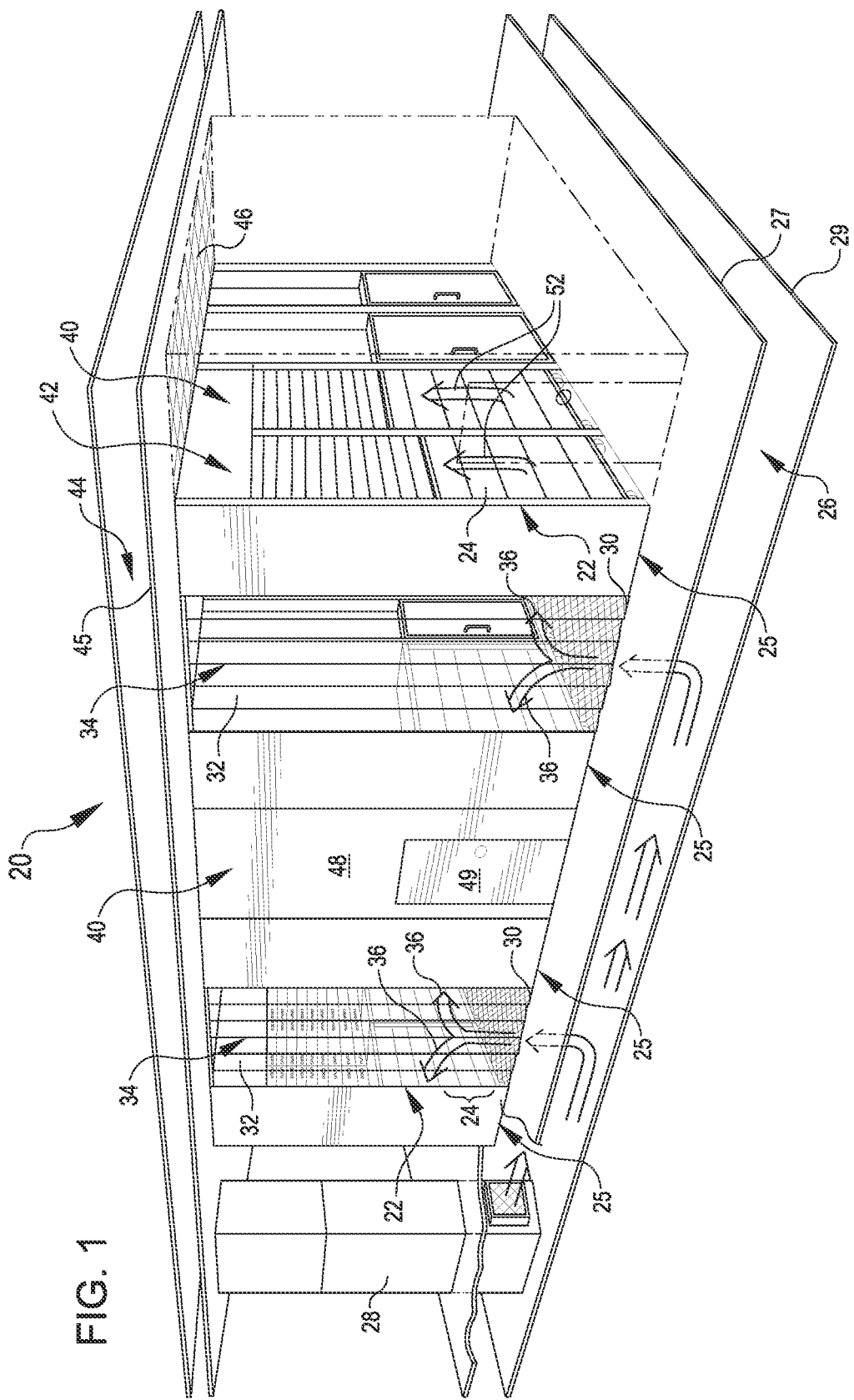
FIG. 1 is a schematic illustration of a datacenter according to certain embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described herein relate to covers, blockers, hoods, canopies, or other barriers that are selectively movable to block different flow paths and/or passages within an air handling unit. For example, a barrier may initially be in a position blocking access of air through a bypass passage and thereby direct all air through a main passage and an evaporative cooling system, mechanical cooling system (such as a refrigerant coil), or other cooling module therein. The barrier can be moved from completely covering the bypass passage to completely covering the main passage, which may cause all air flowing through the air handling unit to be directed through the bypass passage without undergoing effects of the cooling module. The barrier can also be movable to intermediate positions that partially block the bypass passage and the main passage by corresponding correlating amounts. For example, as an illustrative example, the barrier may cover the 40% of the bypass passage and 60% of the main passage in one position or may be moved to cover 50% of each passage in another position, etc. If the passages are different sizes, the barrier may cover, for example, 75% of one passage and 50% of the other passage, or some other combination of percentages that does not add up to exactly 100%. Use of a single barrier to alternatively cover one or the other of the passages or some combination of a portion of each of the passages may provide a degree of control that is beneficial and simple to control and do so in a manner that is less costly than providing individually controllable damper assemblies or other types of individual restrictions on each of the passages.

The air handling units and associated components described herein may be utilized within datacenters. However, the air handling units and associated components are not limited to usage in datacenters and may be implemented in any other environment in which control of air flow and related characteristics may be relevant. In various embodiments, the air handling units and associated components described herein are used in a datacenter that includes internal walls or other structures that form separations between one or more hot and cold zones, or aisles. The cold aisle or aisles are used for providing cool air for the servers and/or network hardware and for access by workers or administrators. The hot aisle or aisles receive heat exhausted from servers and/or networking hardware within the datacenter. This heat is exhausted out of the datacenter by fans and/or natural convention currents that occur in the datacenter.

To aid in air flow, computing devices are arranged so that they draw air from a cold aisle and exhaust air into a hot aisle. For example, servers are mounted in the datacenter so that a front portion, including intake vents for cooling, faces and is exposed to a cold aisle of the datacenter. A rear portion, including an exhaust fan, faces a hot aisle of the datacenter. In this manner, the server is cooled by drawing cold air from the cold aisle and the air that is heated by the server is exhausted into the hot aisle. The servers or racks for the servers can be mounted so that they extend through a structure that separates a cold aisle and a hot aisle.

In a similar manner, networking or other hardware can be mounted so that air intake is exposed to the cold aisle, with exhaust fans exposed to a hot aisle. Because typical networking hardware includes exhaust on a side and intake on an opposite side, the networking hardware racks are typically positioned so that the intake is exposed to the cold aisle for drawing cold air, and the exhaust side is exposed to the hot aisle, permitting hot air from the networking hardware to blow into the hot aisle.

In operation, the cooling fans of the networking hardware draw cool air from a cold aisle and exhaust hot air into a hot aisle. Similarly, the fans for the servers draw air from a cold aisle into a hot aisle. Thus, the standard cooling structures supplied for servers and networking hardware provide airflow from the cold aisles, through the equipment, and into the hot aisles.

The hot air in the hot aisles flows to the top of the datacenter (e.g., via convection currents), and can be vented out of the datacenter. Cool air can be provided to the cold aisles by drawing air from outside the datacenter into the cold aisle, and/or from conditioned air being supplied to the cold aisle, for example from chillers. The chillers may correspond, for example, to computer room air handling units located around a periphery of—or remote from—a room with the hot and cold aisles. Fans may be provided to enhance convection flow.

Air handling units may provide airflow that is ultimately used to cool components within a server rack or a network hardware rack. As used herein in the specification and claims, "server rack" is utilized to mean either a server rack or a network hardware rack, to avoid having to repeat both throughout the description. In some cases network racks are turned sideways, and may require some spacing between network hardware racks for technician access, whereas servers exhaust out through a back exhaust fan, and thus server racks can be installed immediately adjacent to one another.

Referring now to the drawings, in which like reference numerals represent like elements throughout the several views, FIG. 1 shows a datacenter 20 in which cooling units and associated features described elsewhere herein may be implemented according to various embodiments. The datacenter 20 includes several server racks 22 having servers 24 mounted therein. Although the servers 24 are diagrammatically shown as rectangles in the drawings, the servers may fill only portions of the rack, as is known. As described above, the server racks 22 may alternatively include network hardware equipment, not shown.

The datacenter 20 includes a cooling flow defining hot and cold aisles, as described above. In various embodiments shown in the drawings, a cold air plenum 26 is attached to a cold air supply 28, which may be, for example, chillers, air conditioning, outside air venting, computer room air handling units, and/or other cool air supply. The cold air supply 28 is shown located at a periphery of a room of the datacenter 20, as is typical to allow as much space as possible in a climate-controlled space to be used for servers 24, although any other placement away from the periphery of the room may also be utilized as desired.

Air from the cold air plenum 26 flows through vents 30 in the floor 27 of the datacenter 20. The air that flows through the vent 30 flows into a cold aisle 34 for the datacenter. In various embodiments, chilled air in the cold aisle 34 can be contained by a cold air containment system, which may be, for example, air curtains 32. The cold air containment system (e.g., the curtains 32) prevents flow of the chilled air out of the cold aisle 34. As shown by the arrows 36, cold air from the cold air plenum 26 flows out of the vents 30 and into the server racks 22. This flow may be provided, for example, by the fans that are provided on the servers 24 or other network hardware equipment, as described above.

Hot aisles 40 are also provided in the datacenter 20. In FIG. 1, the hot aisles 40 are enclosed structures, and part of the wall for the far right hot aisle in FIG. 1 is depicted as transparent to show detail. As described above, these hot aisles 40 are isolated from the cold aisles 34 by the server racks 22 and the cold air containment system, in the example shown, the air curtains 32. In addition, in accordance with embodiments, a hot aisle containment structure 42 is provided for containing the hot air in the hot aisle and directing that air to a hot air plenum 44 in or above the ceiling 45 of the datacenter 20.

The hot aisle containment structure 42 includes structures that are assembled to seal the area around the back end of the server racks 22 in the datacenter 20. The hot aisle containment structure 42 prevents the flow of hot air exhausting from the servers 24 back toward the cold aisle 34 or other parts of the datacenter 20. Although the hot aisle containment structure 42 is shown in FIG. 1 as solid panels, in some embodiments, it may additional or alternatively include flexible structures such as curtains similar to the air curtains 32. In various embodiments, the hot aisle is enclosed by additional structures, such as walls 48 at the ends of the hot aisle. As shown in FIG. 1, such walls can enclose one side of a hot aisle 40 at the end of the datacenter 20. Doors 49 can be provided for access into the hot aisle 40.

Rows 25 are also defined in the datacenter 20. The rows 25 correspond to the space occupied by the server racks 22 when installed and/or the space designated for receiving the server racks 22 for installation. The rows 25 shown in FIG. 1 provide at least part of the separation between the hot aisles 40 and the cold aisles 34 of the datacenter 20.

FIG. 1 includes diagrammatic representation of airflow in the datacenter 20 in accordance with embodiments. As can be seen, air flows from the cold air plenum 26, up through the grates 30 and into the cold aisles 34 (e.g., as depicted by arrows 36). The chilled air is drawn through the servers 24 in the server racks 22 (e.g., through servers positioned in the rows 25) and is exhausted by the servers into the hot aisle 40 (e.g., as illustrated by arrows 52). The air is heated as it cools the servers 24, and thus is warm or hot when it enters the hot aisle 40. The heated air then exits the hot aisle 40 and flows through vents 46 into the hot air plenum 44. The hot aisle containment structure 42 and the air curtains 32 (or other cold air containment systems) prevent or limit the flow of air along other flow paths than those just described.

The cold air plenum 26 depicted in FIG. 1 is defined between a subfloor 29 and the floor 27. The floor 27 is positioned raised above the subfloor 29, for example, to provide space for the cold air plenum 26 and/or for routing of other components such as data cables, power cables, electrical wiring, plumbing, etc. (not shown). The subfloor 29 may correspond to a concrete slab, for example, as may be included on a ground level of a building (e.g., as part of the building foundation) or on a floor on other than ground level (e.g., as part of an infrastructure of an upper story or basement story of the building). The subfloor 29 may additionally or alternatively include any combination of girders, beams, or other structural elements arranged to provide a suitable base floor for anchoring to for seismic purposes.

Figure 2:
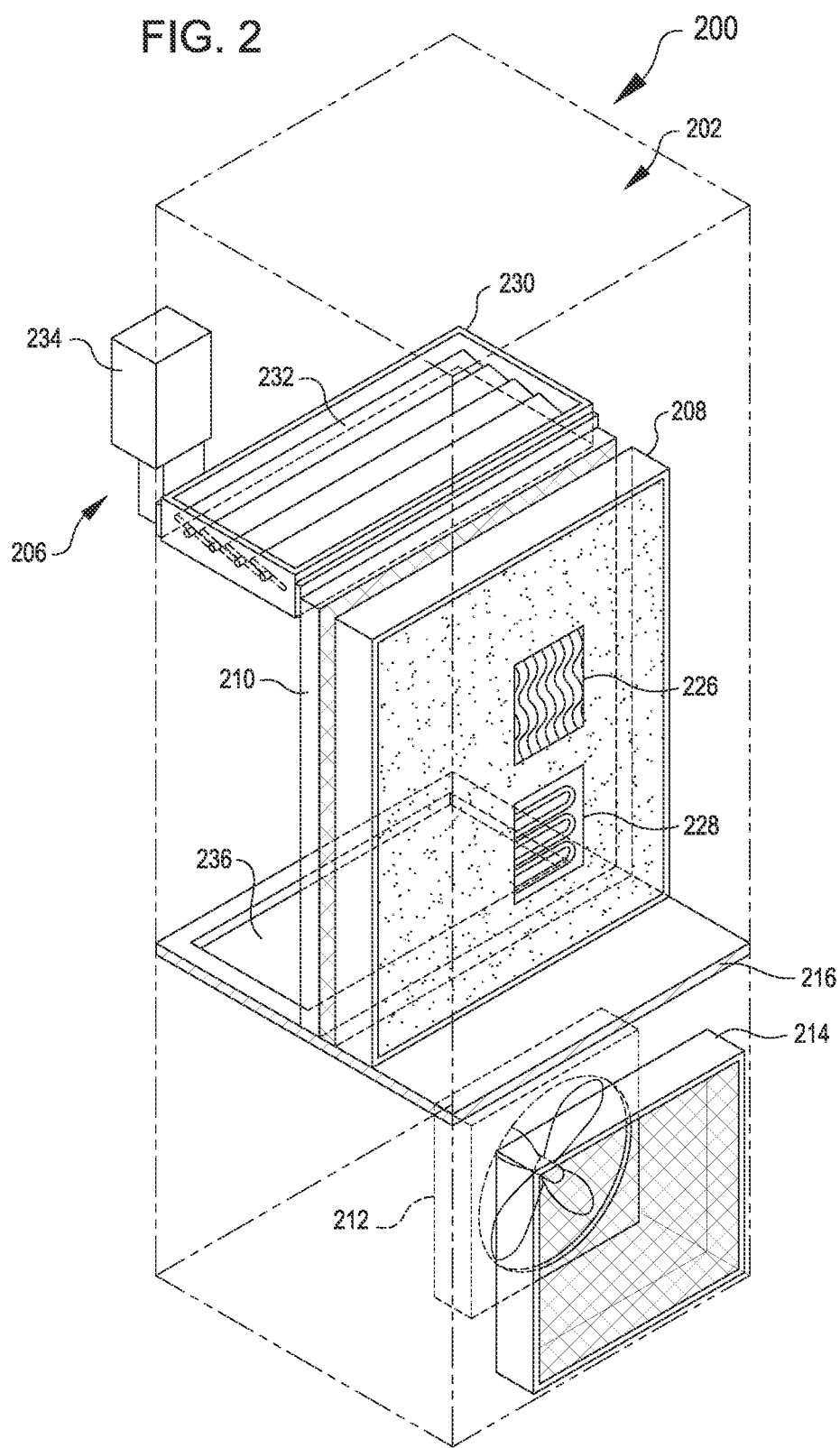
FIG. 2 illustrates a perspective view of one example of an air handling unit that can be used in the datacenter of FIG. 1 according to certain embodiments.

FIG. 2 illustrates a perspective view of an air handling unit 200 that may be utilized in the arrangement of FIG. 1. The air handling unit 200 can include components that are conventionally utilized, and therefore may correspond to a cooling unit that may be replaced and/or retrofit with respect to other components and/or assemblies described herein. The air handling unit 200 may be utilized, for example, in place of or as part of the cold air supply 28 in FIG. 1.

In FIG. 2, the air handling unit 200 is shown with components arranged relative to an internal volume 202. Generally, the air handling unit 200 shown in FIG. 2 includes a damper assembly 206, a cooling module 208, a screen 210, a blower 212, a filter 214, and a base 216. Many of these elements are also shown in FIG. 3, with respect to which operation and structure of the air handling unit 200 and respective parts will be described.

Figure 3:
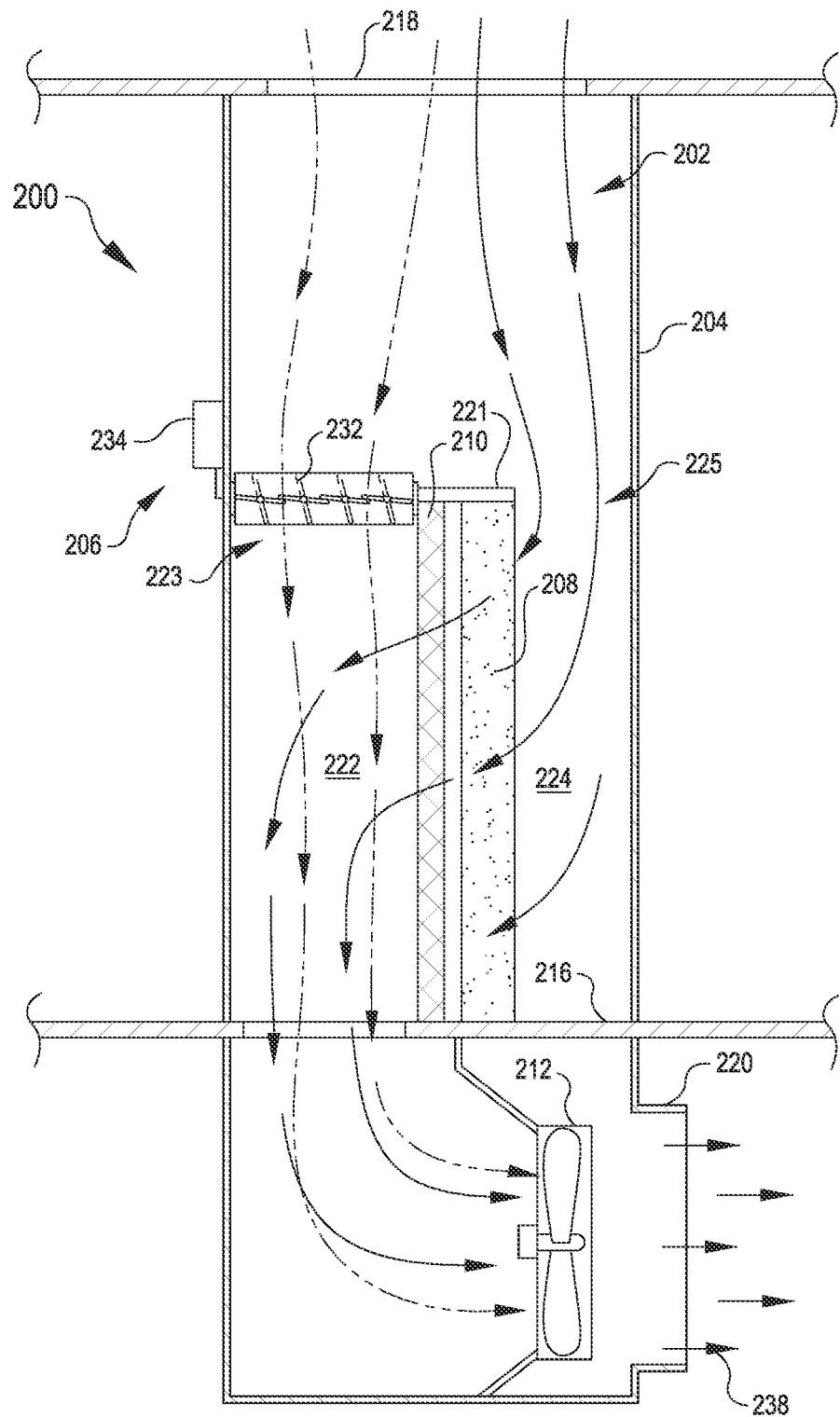
FIG. 3 illustrates a side view of the air handling unit of FIG. 2 according to certain embodiments.

FIG. 3 illustrates a side cutaway view of the air handling unit 200 from FIG. 2. The internal volume may be defined by a housing 204 shown in side profile in FIG. 3. The housing 204 may include appropriate walls and/or panels arranged along the boundaries of the internal volume 202. The housing 204 may define the internal volume 202 and encapsulate or at least partially surround a space in which a characteristic (such as humidity and/or temperature) of air moving through the air handling unit 200 is adjusted or modified. The housing 204 can define an inlet 218 and an exhaust 220, which may each correspond to respective openings formed through the housing 204 to permit flow therethrough of air.

In operation, air may be introduced through the inlet 218 of the air handling unit 200 and discharged through the exhaust 220. While traveling between the inlet 218 and the exhaust 220, the air can undergo exposure to elements that may change a temperature, humidity, and/or other characteristic of the air. Routing of the air may be controlled to affect a degree or an extent to which one or more characteristics of the air is or are changed while passing through the internal volume 202. For example, in FIG. 3, air can travel along a first airflow passage 222 (e.g., as depicted by arrows in broken line in FIG. 3). Air can additionally or alternatively travel along a second airflow passage 224 (e.g., depicted by arrows depicted in solid line in FIG. 3). Air traveling along the second airflow passage 224 may be exposed to and/or travel through the cooling module 208. Air traveling along the first airflow passage 222 may bypass the cooling module 208. Hence, the first airflow passage 222 may alternatively be considered a bypass passage relative to a main passage corresponding to the second airflow passage 224. Air from both passages may mix together such that restricting or otherwise changing flow rates through each of the passages will affect the resulting temperature, humidity, and/or other characteristic of the mixed air.

The cooling module 208 can include any suitable structure for adjusting a temperature and/or a humidity of the air passing through it. For example, although the cooling module 208 is depicted as a functional block in FIG. 3, some examples of suitable structure that may be included in the cooling module 208 are also shown in FIG. 2.

As one example, on an upper portion of the cooling module 208 in FIG. 2, an upper cut away portion is shown exposing a portion of an evaporative cooling system 226. The evaporative cooling system 226 is depicted with a series of curved ribs in FIG. 2, but may alternatively include any other form of evaporative cooling system 226 and/or any other form factor of evaporative media, including, but not limited to sponges, mesh, or other porous material. Generally, in operation, the evaporative cooling system 226 includes media that is saturated with water or a surface, nozzle, or other component that otherwise provides exposure to water so that air flowing across or through the evaporative cooling system 226 will be exposed to the water. Air traversing the evaporative cooling system 226 can accordingly be humidified. Additionally or alternatively, air traversing the evaporative cooling system 226 be cooled, e.g., undergoing a drop in temperature as a result of heat from the air being expended in causing moisture from the evaporative cooling system 226 to evaporate. Cooling the air can increase the relative humidity of the air, e.g., due to decreases in air temperature causing corresponding decreases in the air's capacity to retain moisture. The relative humidity level of the air may also rise as a result of the evaporated moisture being retained in the air and increasing a total amount of moisture in the air. Non-limiting examples structures for use for or in place of evaporative cooling system 226 can include evaporative systems that utilize nozzles to atomize water into an airflow path, ribs oriented non-parallel to an airflow path and fed with water by a pump from a reservoir that may also serve to collect excess water from the bottom of the ribs, and/or mesh surfaces that include a fibrous or mesh material with a large amount of surface area over the individual strands of the surface that are subject to application of water by periodic bursts from supply nozzles aimed at the mesh.

As another example, on a lower portion of the cooling module 208 in FIG. 2, a different, lower cut-away portion is shown a portion of a mechanical cooling system 228. The mechanical cooling system 228 is depicted in FIG. 2 as including cooling coils, but may additionally or alternatively include structure of any other form factor of a refrigerant-conveying conduit that functions for heat transfer without communicating the refrigerant into the air. In operation, air traveling through or exposed to the mechanical cooling system 228 may transfer heat from the air to coils or other structure of the mechanical cooling system 228. For example, the heat may be absorbed by refrigerant within the mechanical cooling system 228. In this manner, the air passing over the coils may be cooled by the passage and transfer of heat to refrigerant in the mechanical cooling system 228.

Turning again to FIG. 3, the screen 210 may be a mist eliminator screen. The screen 210 can function to eliminate mist carried by air traveling through the cooling module 208. For example, the screen 210 may include fibers spaced at an appropriate spacing to catch moisture droplets and prevent moisture from the cooling module 208 from being absorbed into air that has bypassed the cooling module 208 by travel through the first airflow passage 222 (e.g., illustrated by arrows in broken line in FIG. 3).

The first airflow passage 222 and the second airflow passage 224 are shown separated at least in part by a divider 221 in FIG. 3 (shown at least partially omitted in FIG. 2 for ease of viewing the screen 210 and cooling module 208). The divider 221 is shown as a plate over the cooling module 208 and the screen 210 but may correspond to any structure that separates a first entrance 223 to the first airflow passage 222 from a second entrance 225 to the second airflow passage 224. The divider 221 can form a portion of each of the first airflow passage 222 and the second airflow passage 224. For example, the divider 221 may have one side defining a face or boundary surface of the first airflow passage 222 and a second side defining a face or boundary surface of the second airflow passage 224. The first airflow passage 222 and the second airflow passage 224 additionally or alternatively can be separated by other structures, including but not limited to the screen 210, portions of the housing 204, or other structure.

The damper assembly 206 may affect a relative distribution of airflow among the first airflow passage 222 and the second airflow passage 224. For example, as depicted in FIG. 2, the damper assembly 206 includes a frame 230 that supports adjustable blades 232. The blades 232 are actuatable in response to control by a controller 234.

The controller 234 can include any appropriate combination of hardware and/or software and/or other structure suitable to provide the described functionality. The controller 234 may include a computing device that includes a processor and a computer-readable storage medium or memory storing instructions that, when executed by the processor, allow the computing device to perform its intended functions. The processor may comprise one or more general purpose computers, dedicated microprocessors, or other processing devices capable of communicating electronic information. Examples of the processor include one or more application-specific integrated circuits (ASICs), field programmable gate arrays (FPGAs), digital signal processors (DSPs) and any other suitable specific or general purpose processors. The memory can be non-transitory and may represent any collection and arrangement of volatile or nonvolatile, local, or remote devices suitable for storing data. Examples of the memory include, but are not limited to, random access memory (RAM) devices, read only memory (ROM) devices, magnetic storage devices, optical storage devices or any other suitable data storage devices. The controller 234 may additionally or alternatively include any form of switch or other control device operable to exert control over the blades 232 of the damper assembly 206 in response to input from one or more sensors or other form of input. In one example, a user (e.g., a datacenter administrator or a HVAC technician) may use an interface associated with the controller 234 to adjust parameters to alter a manner in which cooling systems function, such as by modifying goal temperatures, triggering events, timing, and/or other characteristics of cooling system operation. In some embodiments, the controller 234 can additionally or alternatively operate automatically, without ongoing input from a user. For example, the controller 234 may automatically process information from sensors and respond by controlling elements associated with the controller 234.

The controller 234 can control the blades 232 and a relative orientation of the blades 232. Controlling the relative orientation of the blade 232 may change an amount of airflow permitted through the frame 230. The frame 230 may be positioned in or adjacent an entrance 223 to the first airflow passage 222. The frame 230 may have a cross section that matches a cross section of the first airflow passage 222 such that substantially all air passing into the second airflow passage 224 passes through the frame 230. In operation, the blades 232 of the damper assembly can act as an obstruction that prevents at least some air from traveling into the first airflow passage 222, thereby diverting at least some air to travel along the second airflow passage 224 and through the cooling module 208. Thus, a relative amount of air traveling through the cooling module 208 can be controlled at least in part by a degree or extent to which the damper assembly 206 is open. For example, if the damper assembly 206 is fully closed, substantially all air will travel through the second airflow passage 224 and through the cooling module 208. Alternatively, if a lesser extent of cooling is desired in a particular situation, the operation of the cooling module 208 may be maintained at a steady level, while the damper assembly 206 alone is modulated to adjust an amount of airflow bypassing the cooling module 208. This may cause the resulting air reaching the exhaust 220 to be at a state of cooling that is less than if all of the air had been directed through the cooling module 208. The air passing through the first airflow passage 222 and through the second airflow passage 224 can be mixed and discharged through the exhaust 220 with a set of combined shared characteristics, such as having a uniform temperature, humidity, pressure, velocity, and/or other characteristic.

The blower 212 can push air out of the exhaust 220 (e.g., as depicted by arrows 238) in the arrangement depicted in FIG. 3. However, other arrangements are also possible. For example, the blower 212 may be positioned elsewhere relative to the housing 204, including outside of the housing or at another position within the housing other than that depicted in FIG. 3. The blower 212 can correspond to a fan or impeller or any other structure of an air mover. Similarly, although the filter 214 is depicted in a position arranged to catch any particulate in the air moved by the blower 212, the filter 214 may be arranged at other places relative to the housing 204 of the air handling unit 200.

The base 216 may support portions of the cooling module 208, the screen 210, and/or the housing 204. The base 216 may form part of the floor 27 (FIG. 1) or may otherwise be arranged to support the air handling unit 200 relative to the floor 27. As may be best seen in FIG. 2, the base 216 can include an opening 236 that provides airflow communication through the base 216, e.g., so that airflow from the air handling unit 200 can move across the level of the floor 27 (FIG. 1) and into the cold air plenum 26.

Air flowing through the damper assembly 206 may be subject to a pressure drop or other energy penalty, e.g., due to the air encountering resistance from contact with structure that the air must flow around. Accordingly, although in some cases a second damper could be installed as a replica also to provide fine control over access through the second entrance 225 into the second airflow passage 224 that includes the cooling module 208, such a second damper assembly is typically not included because it would create additional cost of parts and additional energy penalties in use. Rather, airflow is typically designed in air handling unit 200 so that there is no obstruction at the second entrance 225 of the second airflow passage 224 so that air will always flow through the cooling module 208 to at least some degree when air is traveling through the air handling unit 200.

Figure 4:
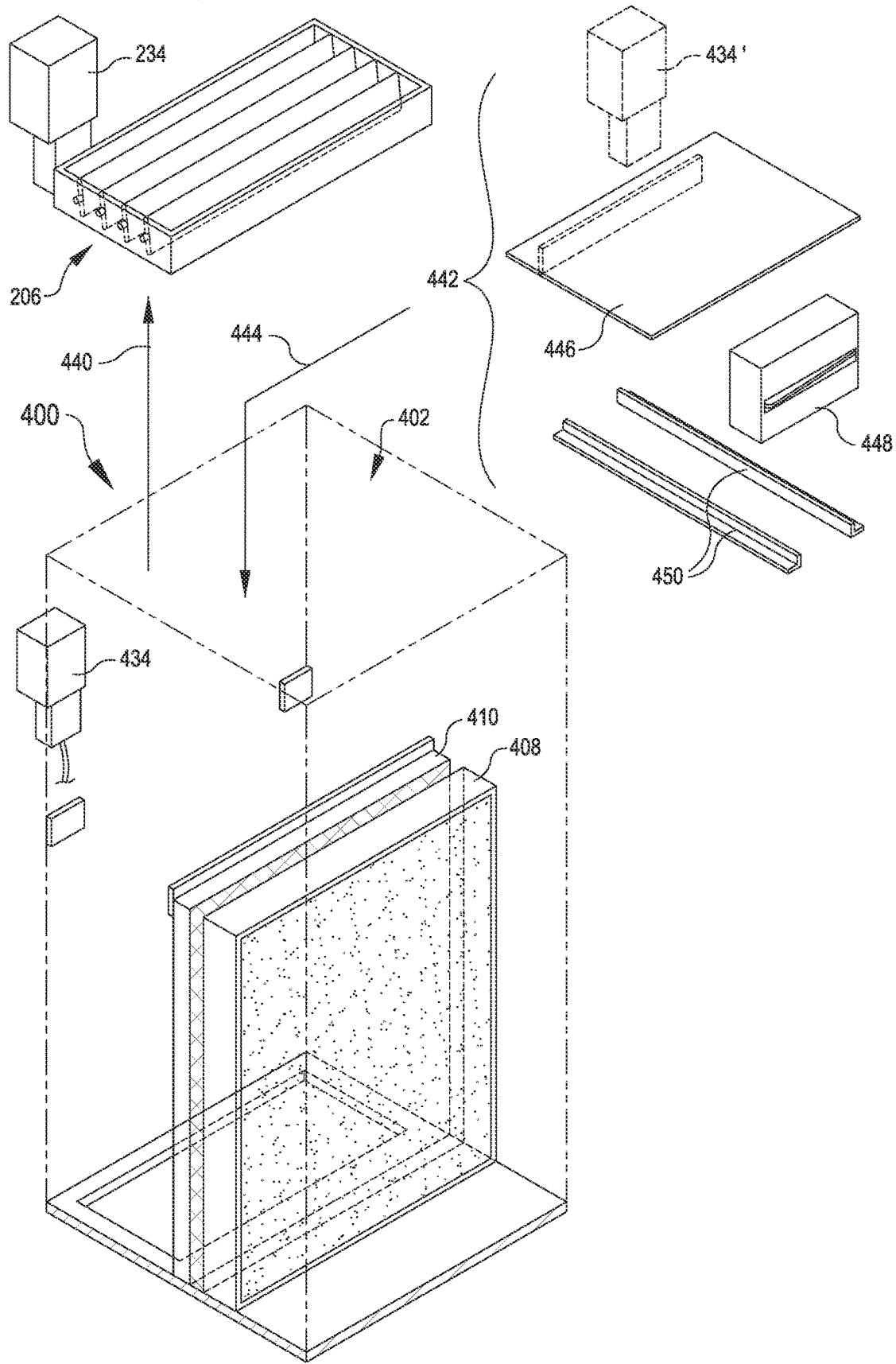
FIG. 4 illustrates a perspective view of an air handling unit that may be utilized with respect to the data center of FIG. 1, for example, as a retrofit of the air handling unit of FIGS. 2-3, according to various embodiments.

FIG. 4 depicts a perspective view of another air handling unit that may be utilized with respect to the data center of FIG. 1 according to various embodiments. The air handling unit 400 may correspond to an instance of the air handling unit 200 that has been or is being subject to a retrofitting operation. To this end, the air handling unit 400 in FIG. 4 as depicted with a damper assembly 206 being removed (e.g., as at arrow 440). FIG. 4 also depicts a kit 442 that may be installed (e.g., as at arrow 444) to retrofit the air handling unit 400. However, the air handling unit 400 is not limited to a retrofit version of air handling unit 200; rather the air handling unit 400 may equally correspond to a retrofit or originally manufactured apparatus. The air handling unit 400 nevertheless is depicted with elements similar to those described with respect to air handling unit 200, and as such, description of those elements is not repeated herein.

The kit 442 in FIG. 4 can be installed into the internal volume 402 of the air handling unit 400, such as depicted by arrow 444. The kit 442 in FIG. 4 includes a cover, hood, canopies, blocker, or other barrier 446, an actuator 448, and mounting components 450. The components of the kit 442 can be installed in the internal volume 402 with respect to the position of other components therein, such as the cooling module 408 (which may be an example of the cooling module 208) and/or the screen 410 (which may be an example of the screen 210).

The air handling unit 400 in FIG. 4 is shown having a controller 434. In instances when the air handling unit 400 is a retrofit device, the controller 434 may be an example of the controller 234 and may correspond to a controller retained when other parts of the damper assembly 206 or associated therewith have been removed as at arrow 440. Additionally, or alternatively, the controller 434 may correspond to a new controller 434' that may be provided as part of the kit 442 or may correspond to a part of the kit 442. Using the controller 234 from the damper assembly 206 may allow for fewer costs to be incurred in a retrofitting operation. For example, the controller 234 of the damper assembly 206 may be adjusted to provide suitable control to the actuator 448, and/or the actuator 448 may be particularly configured for the operability with the controller 234 of the damper assembly 206.

Figure 5:
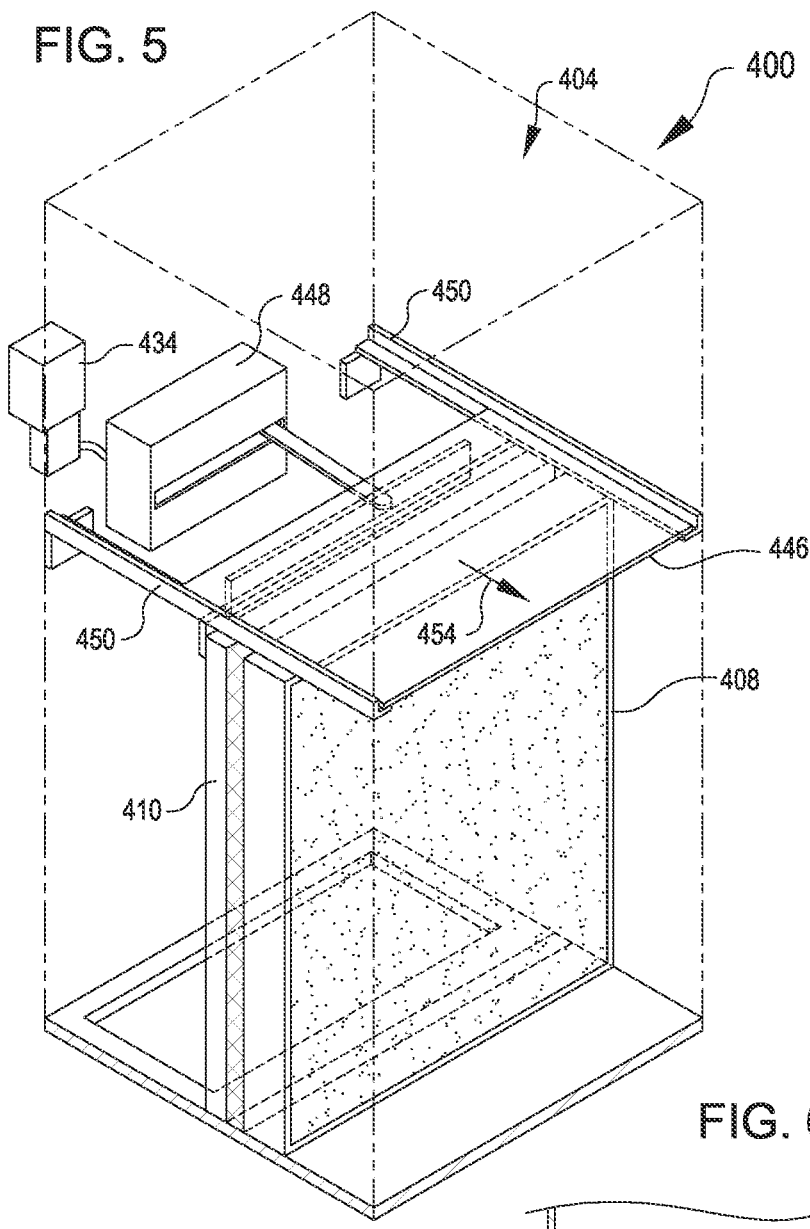
FIG. 5 illustrates a perspective view of the air handling unit of FIG. 4 with a barrier blocking a second airflow passage according to various embodiments.

FIGS. 5-8 depict the air handling unit 400 in operation at various stages relative to the components of the kit 442 depicted in FIG. 4. An installed state of the kit 442 is depicted in FIG. 5. For example, the mounting components 450 may be mounted to wall of the housing that defines the internal volume 404 The mounting components 450 in FIG. 4 are depicted as rails, but may correspond to any other structure for supporting the barrier 446 and facilitating movement of the barrier 446 between different positions. For example, in FIG. 5, the mounting components 450 are shown installed above the cooling module 408 and the screen 410. The mounting components 450 can provide a surface along which the barrier 446 can slide or otherwise linearly translate.

The actuator 448 is depicted in FIG. 5 coupled with the controller 434. The actuator 448 is also shown mounted on a wall of the enclosure that defines the internal volume 402. The actuator 448 shown includes a swinging boom operable to move the barrier 446, although the actuator 448 may include any other linear actuator or other variety of actuator.

Figure 6:
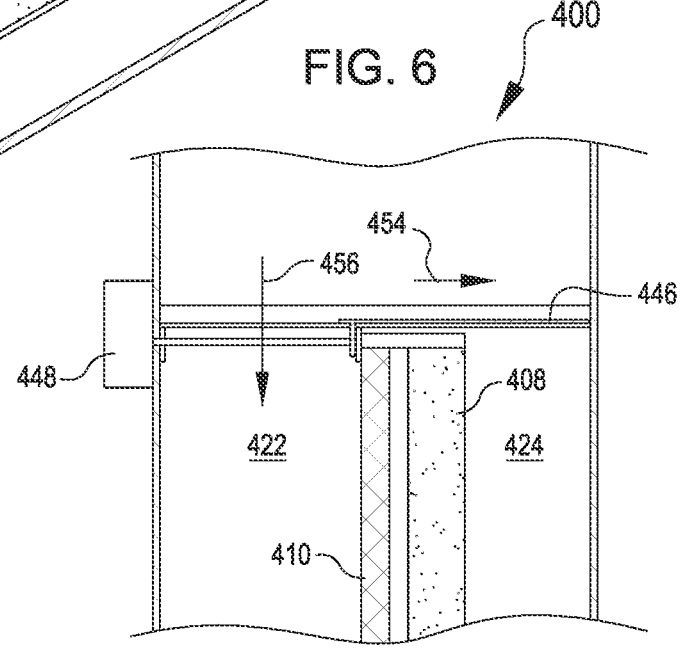
FIG. 6 illustrates a side view of the state shown in FIG. 5 according to various embodiments.

FIGS. 5-6 respectively depict perspective and side views in which the barrier 446 is in a position fully blocking or closing off the second airflow passage 424. In operation, the actuator 448 can move the barrier 446 (e.g., by imparting motion to a flange or other contact surface 452) to impart motion to the barrier 446. The barrier 446 may correspond to any air impermeable material including, but not limited to, plastic, metal, or wood.

The air handling unit at 400 may reach the state depicted in FIGS. 5 and 6 by action of the actuator 448 acting on the barrier 446 to move the barrier 446 over the second airflow passage (as illustrated by arrow 454 in both FIGS. 5 and 6). Thus, the barrier 446 in FIG. 6 may fully obstruct the second airflow passage 424. At the same time, the barrier 446 is also shown fully exposing the first airflow passage 422 in FIG. 6. In this configuration, air may flow (as at arrow 456) through the first airflow passage 422, thus allowing air to bypass the second airflow passage 424 and the cooling module 408 therein. In this arrangement, the screen 410 may provide an adequate structure to prevent effects of the cooling module 408 from being carried on to air flowing through the first airflow passage 422 (as at 456).

Figure 7:
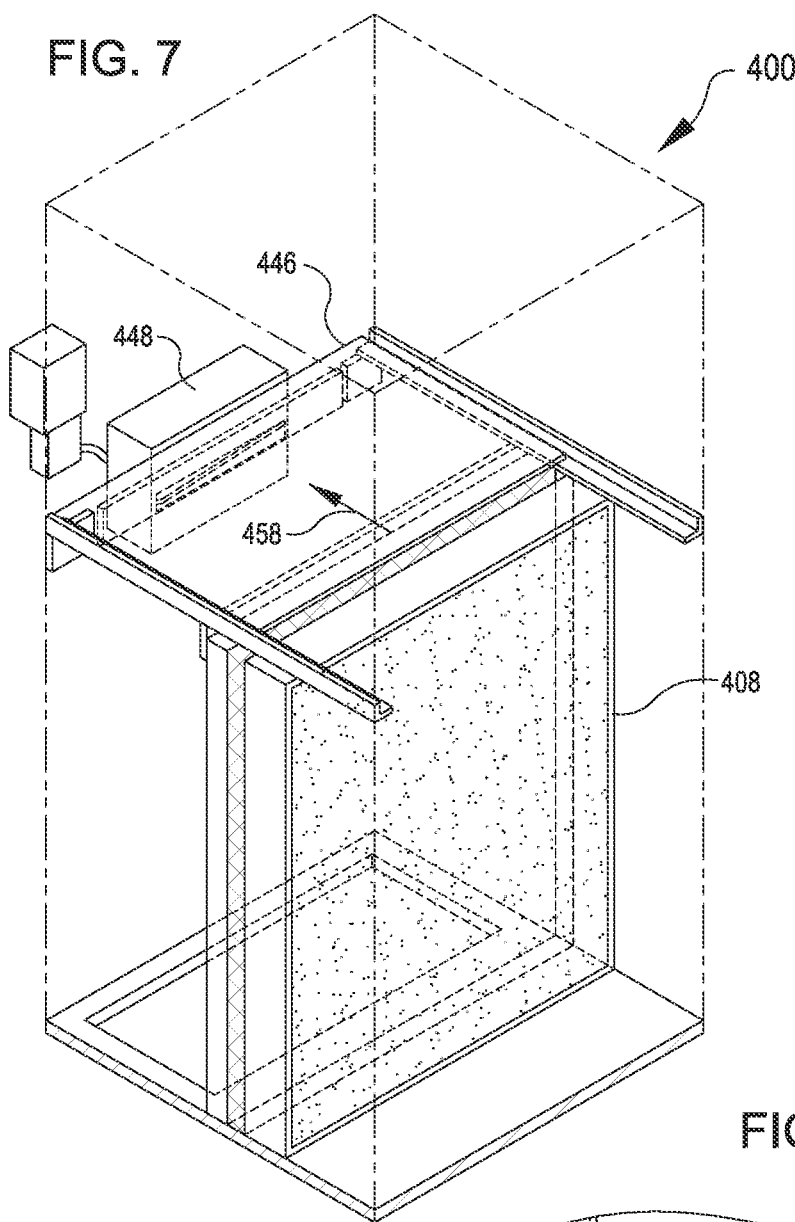
FIG. 7 illustrates a perspective view of the air handling unit of FIG. 4 with a barrier blocking a first airflow passage according to various embodiments.
Figure 8:
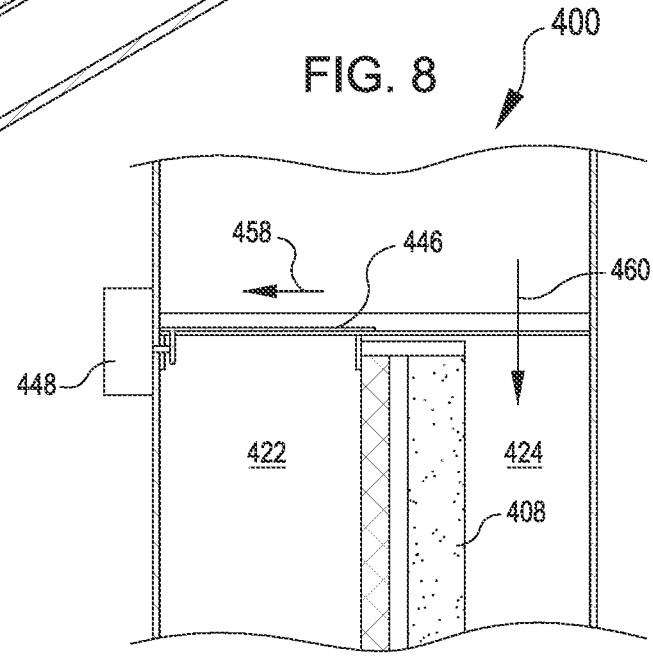
FIG. 8 illustrates a side view of the state shown in FIG. 7 according to various embodiments.

FIGS. 7 and 8 show perspective and side views of the air handling unit 400 with the barrier 446 in a state fully closing off the first airflow passage 422. For example, the air handling unit 400 may arrive at the configuration shown in FIGS. 7 and 8 by operation of the actuator 448 acting on the barrier 446 to cause the barrier 446 to move away from the second airflow passage 424 and towards the first airflow passage 422, as at arrow 458. Positioning the barrier to fully block or obstruct airflow from the first airflow passage 422 may divert or cause all airflow to flow through the second airflow passage 424 (e.g., as at arrow 460) and through the cooling module 408. Such configuration may allow air handling unit 400 to maximize use of the cooling module 408 and obtain air at maximum cooling capacity of the operational state of the cooling module 408.

Additionally, the air handling unit 400 may operate the actuator 448 to cause the barrier 446 to stop at an intermediate position between the extremes shown in FIG. 5 and FIG. 7. Accordingly, such an arrangement (e.g., in which the barrier 446 can alternatively cover all or part of the first airflow passage 422 or all or part of the second airflow passage 424) can allow for a greater degree of control of how much air is flowing through each passage or what ratio of air is permitted through each passage when traversing through the air handling unit 400. In this manner, arrangement of the air handling unit 400 may provide better control at less expense when compared with an option of providing separate damper assemblies 206 over each of the respective airflow passages 422 and 424.

Figure 9:
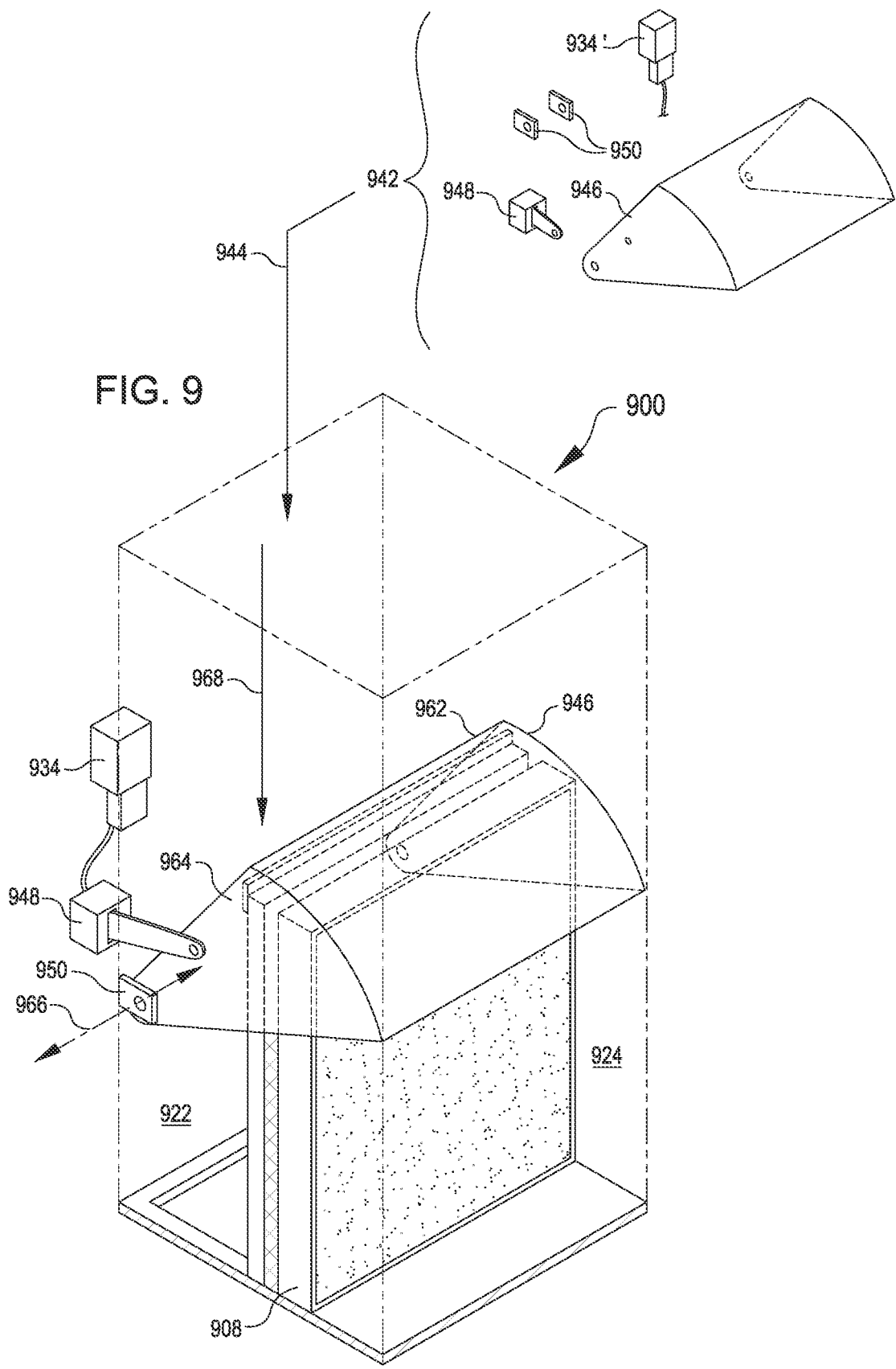
FIG. 9 illustrates a perspective view of another example of an air handling unit that can be used in the datacenter of FIG. 1 according to certain embodiments.

FIG. 9 depicts another air handling unit 900 that can be utilized in the datacenter of FIG. 1. The air handling unit 900 includes various components that are similar to that described with respect to air handling unit 400, and as such, description thereof will not be repeated for similar parts that have similar names and similar reference numbers.

The air handling unit 900 may be retrofit from the air handling unit 200, e.g., similar to the air handling unit 400. FIG. 9 also depicts a kit 942 that may be installed (e.g., as at arrow 944) to retrofit the air handling unit 900. However, the air handling unit 900 is not limited to a retrofit version of air handling unit 200; rather the air handling unit 900 may equally correspond to a retrofit or originally manufactured apparatus.

The kit 942 in FIG. 9 includes a barrier 946, an actuator 948, and mounting components 950. The mounting components 950 in FIG. 9 are depicted as pivot mounts, but may correspond to any other structure for supporting the barrier 946 and facilitating rotating or pivoting movement of the barrier 946 between different positions.

The barrier 946 is depicted in FIG. 9 as a hood or canopy having a hood portion 962 and arms 964. The arms 964 extend from the edges of the hood portion 962 and are secured in the mounting components 950 in a manner that allows the barrier 946 to pivot or rotate about an axis 966 defined by the mounting components 950. The hood surface 962 may have a contour that is curved (e.g., as depicted), flat, or some other suitable shape.

The air handling unit 900 also includes an actuator 948 that is capable of causing the barrier 946 to pivot about the axis 966 and/or the mounting components 950. The actuator 948 may operate in response to the controller 934. The controller 934 may be an example of the controller 234 from the damper assembly 206. The controller 934 may additionally alternatively be a separate controller 934' provided in the kit 942 or otherwise not reclaimed from a damper assembly 206.

In the view in FIG. 9, the barrier 946 is arranged over the second airflow passage 924. The arrangement in FIG. 9 may allow air to flow, for example, along arrow 968. The flow along arrow 968 may be along the first airflow passage 922. The first airflow passage 922 can be exposed by the position of the barrier 946 in FIG. 9

Figure 10:
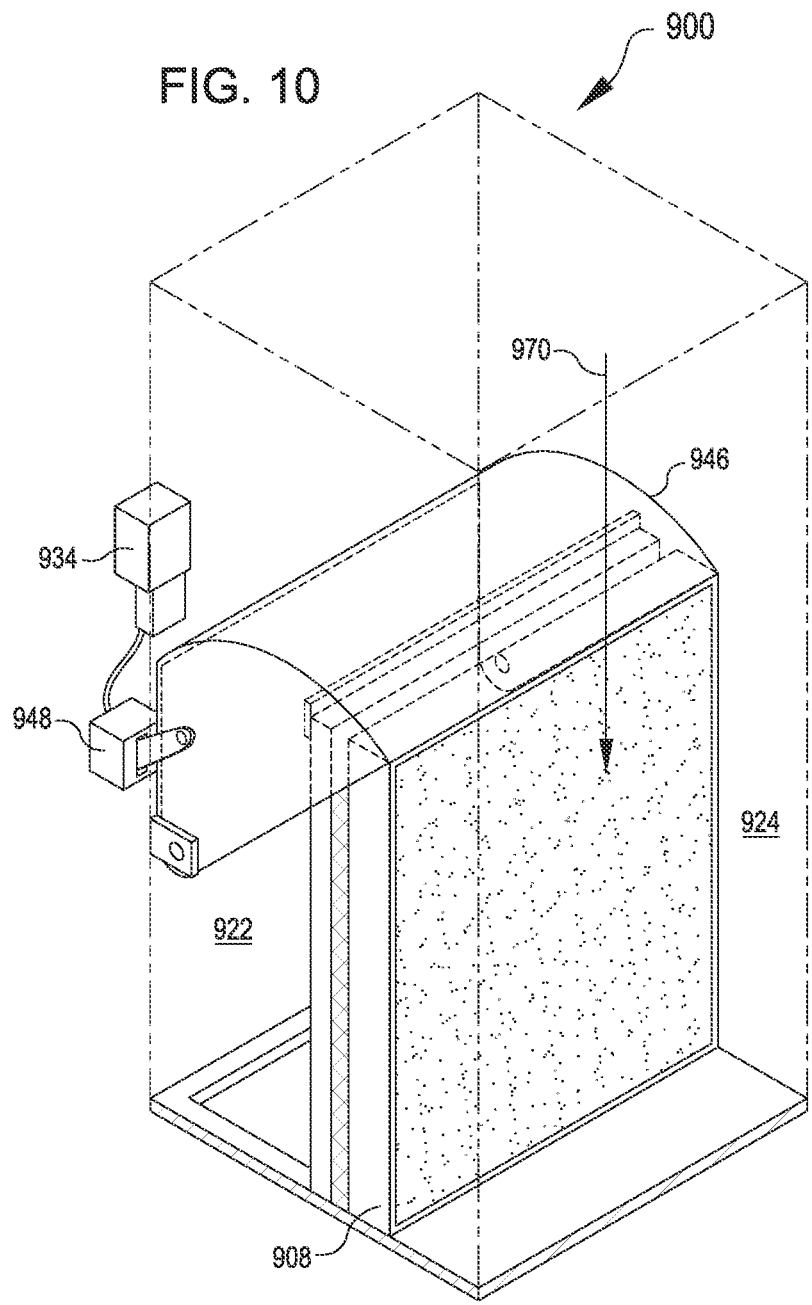
FIG. 10 illustrates a perspective view of the air handling unit of FIG. 9 with a barrier blocking a second airflow passage according to various embodiments.

FIG. 10 depicts the air handling unit 900 with the barrier 946 in a position obstructing the passage of air into the first airflow passage 922. The arrangement in FIG. 10 may allow air to flow, for example, along arrow 970. The flow along arrow 970 may be along the second airflow passage 924. The second airflow passage 924 can be exposed by the position of the barrier 946 in FIG. 10. Routing all the air through the second airflow passage 924 may cause the all the air to flow through the cooling module 908 and maximize the cooled output of the cooling module 908.

The actuator 948 can move the barrier 946 between the position shown in FIGS. 9 and 10. The actuator 948 may be capable of stopping or otherwise positioning the barrier 946 at intermediate positions between either of the extremes shown in FIGS. 9 and 10. For example, the barrier 946 may be moved to an intermediate position to attain a particular ratio or blend of airflow through each of the first airflow passage 922 and the second airflow passage 924 to obtain a particular temperature, humidity, or other characteristic of air being discharged from the air handling unit 900. The barrier 946 can move among any intermediate position or extreme position in response to movement of the actuator 948. Movement of the actuator 948 may be in response to the controller 934.

Other arrangements beside those specifically described above also possible. For example, the air handling units described herein are not limited to a vertical or top-down arrangement. The air handling units may be arranged horizontally or in other arrangements additionally or in lieu of the depicted arrangements.

Furthermore, although the description above refers to barriers that can be moved to entirely block a respective airflow passage, in some embodiments, the barrier may permit some degree of permissible leakage. As an illustrative example, a barrier (such as the barrier 446 or 946) may have a range between one extreme that permits 5% of airflow through the air handling unit to pass through one passage (e.g., a main passage) while 95% of the airflow passes through the other airflow passage (e.g., a bypass passage) and an opposite extreme that instead permits 95% of airflow through the air handling unit to pass through one passage (e.g., the main passage) while 5% of the airflow passes through the other airflow passage (e.g., the bypass passage).

Moreover, other shapes, form factors, and/or sizing of the barrier (e.g., relative to other elements of the air handling unit) can be utilized. For example, FIG. 11 illustrates a variation of the air handling unit 900 in which the barrier 946 is sized differently than in FIGS. 9 and 10. In particular, in FIG. 11, the barrier 946 is shaped and sized so that at an intermediate position (such as that depicted in solid lines, in which the barrier 946 splits airflow so that 50% of the airflow passes through each passage 922 and 924) both passages 922 and 924 are exposed, e.g., without obstruction across either entrance of either passage 922 and 924. For example, the barrier 946 in FIG. 11 is depicted as sized approximately equal or smaller than a corresponding width or other relevant dimension of the divider 221 that separates the respective entrances to the respective passages 922 and 924. More generally, in intermediate positions that the barrier 946 may move among (e.g., as illustrated by arrow 972 or between the extremes shown in phantom line), the barrier 946 may be positioned sufficiently out of the way of either passage 922 and 924 so as to overall provide a low resistance to airflow and yield a corresponding substantially lower pressure drop (or other energy penalty) in comparison to an air handling unit that instead includes a damper assembly that causes a permanent minimum energy penalty from having structure permanently positioned across at least one of the entrances.

As another example, FIG. 12 illustrates a variation of the air handling unit 400 in which the barrier 446 is sized differently than in FIGS. 4-8. In particular, the barrier 446 in FIG. 12 is shaped and sized to fit in an intermediate position over the divider 421 (e.g., in the position depicted in solid lines) such that airflow may travel unimpeded through both passages 422 and 424 (as illustrated respectively by arrows 456 and 460). For example, such an arrangement may provide a low resistance to airflow and yield a corresponding substantially lower pressure drop (or other energy penalty) in comparison to an air handling unit that instead includes a damper assembly that causes a permanent minimum energy penalty from having structure permanently positioned across at least one of the entrances. The barrier 446 in FIG. 12 is also shown suitably sized to fully cover either one of the passages 422 and 424 when the actuator 448 positions the barrier 446 at one or the other of the extremes shown in phantom line in FIG. 12.

Referring again to FIG. 11, the barrier 946 in FIG. 11 is also shown having sealing extensions 975. The sealing extensions 975 may extend from an underside or other periphery of the barrier 946. For example, the sealing extensions 975 may be shaped to provide sealing engagement between the barrier 946 and the divider 921 and/or other structure of the air handling unit 900. The sealing extensions 975 may be made of rubber or other resiliently flexible material. The sealing extensions 975 may contact the divider 921 or other structure of the air handling unit 900 as a result of movement of the barrier 946 and may flex or displace in response to further movement of the barrier 946. In an illustrative example, at a position of the barrier 946 at one extreme shown in phantom toward the right of FIG. 11, the rightward sealing extension 975 may engage a wall of the air handling unit 900, while the leftward sealing extension 975 engages the divider 921. Movement of the barrier 946 toward the left may cause the leftward sealing extension 975 to traverse across the top of the divider 921, for example, flexing to maintain sealing engagement with the divider 921 until the barrier 946 reaches the position shown in solid lines. Such movement of the barrier 946 to the position shown in solid lines may also cause the rightward sealing extension 975 to come into sealing engagement (e.g., and begin to flex against) the divider 921. Further leftward movement of the barrier 946 into the position shown at left in phantom lines may bring the leftward sealing extension 975 into engagement with the opposite wall of the air handling unit, while causing the rightward sealing extension 975 to traverse across the divider 921 (e.g., while flexing to maintain sealing engagement). More generally, the sealing extensions 975 may account for and/or occupy a variable amount of space between the barrier 946 and another structure such as the divider 921, e.g., so that sealing engagement may be maintained to reduce leakage along an underside of the barrier 946.

Various options of form factors for the barrier 946 are also illustrated in FIG. 11. For example, the barrier 946 is shown having both a curved surface 952 (e.g., along a top of the hood surface) and a flat surface 954 (e.g., along a bottom of the hood surface). In various embodiments, the barrier 946 may include only one or the other of the curved surface 952 or the flat surface 954 in a portion of the barrier 946 extending between the arms 964 that support the hood portion. In some embodiments, including only the curved surface 952 may allow the barrier to maintain a close sealing fit between the barrier 946 and divider 921 during travel of the barrier 946. For example, the shape of the curved surface 952 may adequately match a shape of a path of travel of the barrier 946 such that some portion of the barrier 946 can be in contact with the divider 921 (or otherwise sufficiently proximate to the divider 921 to prevent appreciable airflow between the barrier 946 and divider 921) at any position of the barrier 946 along a path of travel of the barrier 946. Thus, in some embodiments, the barrier 946 including the curved surface 952 may allow the sealing extensions 975 to be omitted or rendered redundant for preventing appreciable airflow along an underside of the barrier 946. In some embodiments, including one or more of the sealing extensions 975 can reduce leakage if the barrier 946 only includes the flat surface 954 or otherwise has a hood portion shape that differs from a shape of the path of travel of the barrier 946.

Additionally, although the description above primarily focuses on positioning of a barrier being effective to change an amount of air flowing through the air handling unit to change a temperature and/or humidity of the air passing through there, other characteristics may be adjusted by adjusting the position of the barrier. For example, adjustment of the barrier may affect an amount of airflow—and therefore an amount of air velocity—traveling through the cooling module 208. Altering the velocity in this fashion may cause the throughput of the cooling module to be sufficiently different that it may change a cooling mode of the air relative to the cooling module. For example, with respect to a cooling module that includes cooling conduits with refrigerant or mechanical cooling, the passage of air at one velocity may be adequate to allow condensation on the pipes to occur and thereby extract moisture from the air passing by. This may correspond to what is sometimes termed latent cooling where the latent heat evaporation value of water allows condensation to occur and corresponding extraction of humidity from the air in the form of condensate formed on the pipes. This may differ from another arrangement in which velocity passing through the cooling module may be such that the moisture in the air does not have a chance to condense and is simply cooled by the lower temperature of the coils being passed. This may correspond to what is often termed as sensible cooling in which a moisture content of the air is negligibly impacted by cooling the air.

In addition to or in lieu of adjusting the barrier position to change between modes of cooling (e.g., between sensible and latent cooling), adjusting the barrier position may also alter an extent to which a type of cooling is provided. For example, adjusting the barrier position to change a velocity passing through the cooling module may change an amount of condensate formed and/or an amount of humidity change in air subjected to latent cooling without changing the air velocity enough to switch entirely over to sensible cooling.

In some embodiments, the cooling module may be controlled in conjunction with control of a position of the barrier to affect a type or extent of a cooling mode such as latent or sensible cooling. For example, a rate of coolant provided through a cooling module may be typically regulated in response to a temperature detected downstream of the cooling module, such as by increasing a coolant flow rate in response to a reading above a set point temperature or decreasing coolant flow rate in response to a reading below a set point temperature. When changing the barrier position to adjust characteristics of discharged air, the relevant temperature detected downstream of the cooling module may be raised or lowered in a manner that might cause a change in the coolant flow rate absent some adjustment to the overall control of the cooling module. Thus, in various embodiments, the cooling module may be controlled to maintain or adjust a coolant flow level or other applicable operation level in response to an indication that a different mode (sensible or latent) or extent of cooling is being implemented (e.g., via positioning of the barrier). Options for implementation may include adjusting a set point temperature or switching to control based on humidity levels detected downstream in addition to or in lieu of temperature levels detected downstream. Although the controllers 434 and 934 are primarily described above as controlling position of a respective actuator to adjust a barrier position, in some embodiments, control of the cooling module may additionally or alternatively be controlled by such controllers and/or by separate controllers of the air handling units that may also control or otherwise receive input about the position of the barrier.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method comprising:
   receiving airflow into an air handling unit, the air handling unit comprising,
      a first entrance to a first airflow passage,
      a second entrance to a second airflow passage separated from the first entrance to the first airflow passage,
      a cooling module arranged in the second airflow passage and configured to cool air passing through the second airflow passage, and
      an exhaust configured to discharge air received from either or both of the first airflow passage and the second airflow passage; and
   pivoting an arm coupled with a curved upper surface of a barrier to cause moving of the barrier in the air handling unit from a first position at least partially aligned with and at least partially obstructing passage of the airflow through the first entrance into the first airflow passage into a second position at least partially aligned with and at least partially obstructing passage of the airflow through the second airflow passage and through the cooling module, whereby moving the barrier adjusts a characteristic of the air discharged from the exhaust, wherein a sealing extension extends from an underside of the barrier, the sealing extension sized and arranged for sealing against leakage along the underside of the barrier through the first airflow passage in the first position.

2. The method of claim 1, wherein adjusting the characteristic comprises adjusting a temperature of the air discharged from the exhaust.

3. The method of claim 1, wherein adjusting the characteristic comprises adjusting a mode of cooling of the air between a sensible cooling mode in which temperature of the air is changed and a latent cooling mode in which temperature and humidity of the air is changed.

4. The method of claim 1, wherein the barrier obstructs air passage through the first entrance to a greater degree in the first position than in the second position and obstructs air passage through the second entrance to a lesser degree in the first position than in the second position.

5. The method of claim 1, further comprising pivoting the barrier to an intermediate position in which the first entrance to the first airflow passage is not obstructed by the barrier and in which the second entrance to the second airflow passage is not obstructed by the barrier.

6. An air handling unit, comprising:
   a housing defining an internal volume configured to receive airflow through an inlet and discharge airflow through an exhaust;
   a first airflow passage defined within the internal volume and having a first entrance;
   a second airflow passage defined within the internal volume, positioned adjacent the first airflow passage, and having a second entrance distinct from the first entrance;
   a cooling module arranged in the second airflow passage and configured to remove heat from air passing through the second airflow passage;
   a blocker comprising a solid body having a curved upper surface, the blocker further comprising an arm extending from an end of the curved upper surface;
   an actuator coupled with the blocker and configured for rotating the arm to cause movement of the curved upper surface of the solid body between a first position at least partially aligned with and at least partially blocking the first entrance to the first airflow passage and a second position at least partially aligned with and at least partially blocking the second entrance to the second airflow passage; and
   a sealing extension extending from an underside of the blocker, the sealing extension sized and arranged for sealing against leakage along the underside of the blocker through the first airflow passage in the first position.

7. The air handling unit of claim 6, wherein the sealing extension comprises a first sealing extension, wherein the air handling unit further comprises a second sealing extension extending from the underside of the blocker, the second sealing extension sized and arranged for sealing against leakage along the underside of the blocker through the second airflow passage in the second position.

8. The air handling unit of claim 6, wherein the cooling module comprises evaporative media.

9. The air handling unit of claim 6, wherein the cooling module comprises a refrigerant coil.

10. The air handling unit of claim 6, wherein the blocker is moveable to an intermediate position at least partially blocking the first entrance to the first airflow passage and at least partially blocking the second entrance to the second airflow passage.

11. The air handling unit of claim 6, wherein the blocker is moveable between fully blocking the first entrance to the first airflow passage and fully blocking the second entrance to the second airflow passage.

12. The air handling unit of claim 6, wherein the blocker is moveable between fully exposing the first entrance to the first airflow passage and fully exposing the second entrance to the second airflow passage.

13. The air handling unit of claim 6, wherein the blocker is moveable to:
   the first position, wherein in the first position the blocker is fully blocking the first entrance to the first airflow passage and fully exposing the second entrance to the second airflow passage;
   the second position, wherein in the second position the blocker is fully exposing the first entrance to the first airflow passage and fully blocking the second entrance to the second airflow passage; and
   an intermediate position at least partially blocking the first entrance to the first airflow passage and at least partially blocking the second entrance to the second airflow passage.

14. A kit for retrofitting an air handling unit, the air handling unit comprising (A) a main airflow passage directed through a cooling module that includes evaporative cooling media, (B) a bypass airflow passage routed around the cooling module, and (C) a damper at an entrance of the bypass airflow passage and configured to selectively open and close to change an amount of airflow diverted through the bypass airflow passage and away from both the main airflow passage and the cooling module, the kit comprising:
   a cover comprising a curved upper surface coupled with an arm, the cover configured for movement of the curved upper surface between a first position and a second position, the first position at least partially aligned with and at least partially covering the entrance of the bypass airflow passage and at least partially inhibiting airflow through the bypass airflow passage, the second position at least partially aligned with and at least partially covering an entry of the main airflow passage and at least partially inhibiting airflow through the main airflow passage, wherein the cover further comprises a sealing extension extending from an underside of the cover, the sealing extension sized and arranged for sealing against leakage along the underside of the cover through the bypass airflow passage in the first position; and
   an actuator configured to rotate the arm so as to move the curved upper surface of the cover between the first position at least partially aligned with and at least partially obstructing airflow through the bypass airflow passage and the second position at least partially aligned with and at least partially obstructing airflow through the main airflow passage.

15. The kit of claim 14, wherein the cover is sized so that:
   in the first position the cover fully covers the entrance of the bypass airflow passage, fully inhibits airflow through the bypass airflow passage, fully exposes the main airflow passage, and does not inhibit airflow through the main airflow passage; and
   in the second position the cover fully exposes the entrance of the bypass airflow passage, does not inhibit airflow through the bypass airflow passage, fully covers the main airflow passage, and fully inhibits airflow through the main airflow passage.

16. The kit of claim 14, wherein the kit comprises components configured to replace at least part of the damper, wherein the kit further comprises a mounting component configured to be mounted within the air handling unit for supporting the cover and facilitating movement of the cover between the first position and the second position, wherein the mounting component comprises a pivot mount defining an axis about which the cover rotates to pivot between the first position and the second position.

17. The kit of claim 14, wherein the actuator is configured to be coupled with a controller for the damper and to move the cover in response to control from the controller.

18. The kit of claim 17, wherein the controller is configured to process sensor information and respond by controlling the actuator.

19. The kit of claim 14, wherein the cover is sized approximately equal to or smaller than a corresponding width of a divider between entrances of the main airflow passage and the bypass airflow passage.

* * * * *